(12) United States Patent
Ota

(10) Patent No.: US 10,037,908 B2
(45) Date of Patent: Jul. 31, 2018

(54) OVERHEAD TRAVELING VEHICLE SYSTEM AND TRANSFER CONTROL METHOD FOR OVERHEAD TRAVELING VEHICLE SYSTEM

(71) Applicant: Murata Machinery, Ltd., Kyoto-shi, Kyoto (JP)

(72) Inventor: Tatsuji Ota, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 534 days.

(21) Appl. No.: 14/412,225

(22) PCT Filed: Jun. 18, 2013

(86) PCT No.: PCT/JP2013/066700
§ 371 (c)(1),
(2) Date: Dec. 31, 2014

(87) PCT Pub. No.: WO2014/017221
PCT Pub. Date: Jan. 30, 2014

(65) Prior Publication Data
US 2015/0170946 A1    Jun. 18, 2015

(30) Foreign Application Priority Data
Jul. 26, 2012  (JP) .................................. 2012-165564

(51) Int. Cl.
*H01L 21/677* (2006.01)
*B66C 13/18* (2006.01)
(Continued)

(52) U.S. Cl.
CPC ........ *H01L 21/67733* (2013.01); *B66C 13/18* (2013.01); *B66C 19/00* (2013.01);
(Continued)

(58) Field of Classification Search
CPC ................................................ H01L 21/67733
See application file for complete search history.

(56) References Cited

U.S. PATENT DOCUMENTS 8,915,690 B2 * 12/2014 Ota ................... H01L 21/67733
414/275
9,263,311 B2 * 2/2016 Ota ....................... B65G 1/0457
(Continued)

FOREIGN PATENT DOCUMENTS

| JP | 2001-261284 A | 9/2001 |
| JP | 2012-111635 A | 6/2012 |
| WO | 2011/046171 A1 | 4/2011 |

OTHER PUBLICATIONS

JP 2001-261284 A (English language machine translation of Japanese publication already of record). Murata, Masanao. Sep. 26, 2001. Machine translation retrieved on May 22, 2017 from Espacenet.*

(Continued)

*Primary Examiner* — Jonathan Snelting
(74) *Attorney, Agent, or Firm* — Keating & Bennett, LLP

(57) ABSTRACT

An overhead traveling vehicle includes a hoist and a first sensor that monitors obstacles below, and a local carriage includes a hoist and travels along the track. A buffer is suspended from the track by vertical supports that extend vertically downward, and no members of the buffer are provided directly over load ports. A second sensor, which monitors an obstacle in a vicinity of the load ports and in a passageway-side area on a side opposite to a processing device, is provided on the track and transmits an obstacle detection signal to the overhead traveling vehicle and the local carriage. Upon receiving the obstacle detection signal from the second sensor, the overhead traveling vehicle and (Continued)

the local carriage stop the hoists, and the overhead traveling vehicle does not monitor obstacles in the passageway-side area using the first sensor.

3 Claims, 6 Drawing Sheets

(51) Int. Cl.
*B66C 19/00* (2006.01)
*H01L 21/67* (2006.01)

(52) U.S. Cl.
CPC .. *H01L 21/67259* (2013.01); *H01L 21/67288* (2013.01); *H01L 21/67736* (2013.01); *B65G 2201/0297* (2013.01)

(56) References Cited

U.S. PATENT DOCUMENTS

| | | | |
|---|---|---|---|
| 2010/0003111 A1* | 1/2010 | Yeo | H01L 21/67775 414/222.07 |
| 2012/0263562 A1 | 10/2012 | Mizokawa et al. | |
| 2012/0275886 A1 | 11/2012 | Ota | |
| 2013/0142597 A1* | 6/2013 | Kinugawa | H01L 21/67733 414/222.13 |

OTHER PUBLICATIONS

Official Communication issued in corresponding European Patent Application No. 13822626.1, dated Feb. 8, 2016.

\* cited by examiner

F I G. 7
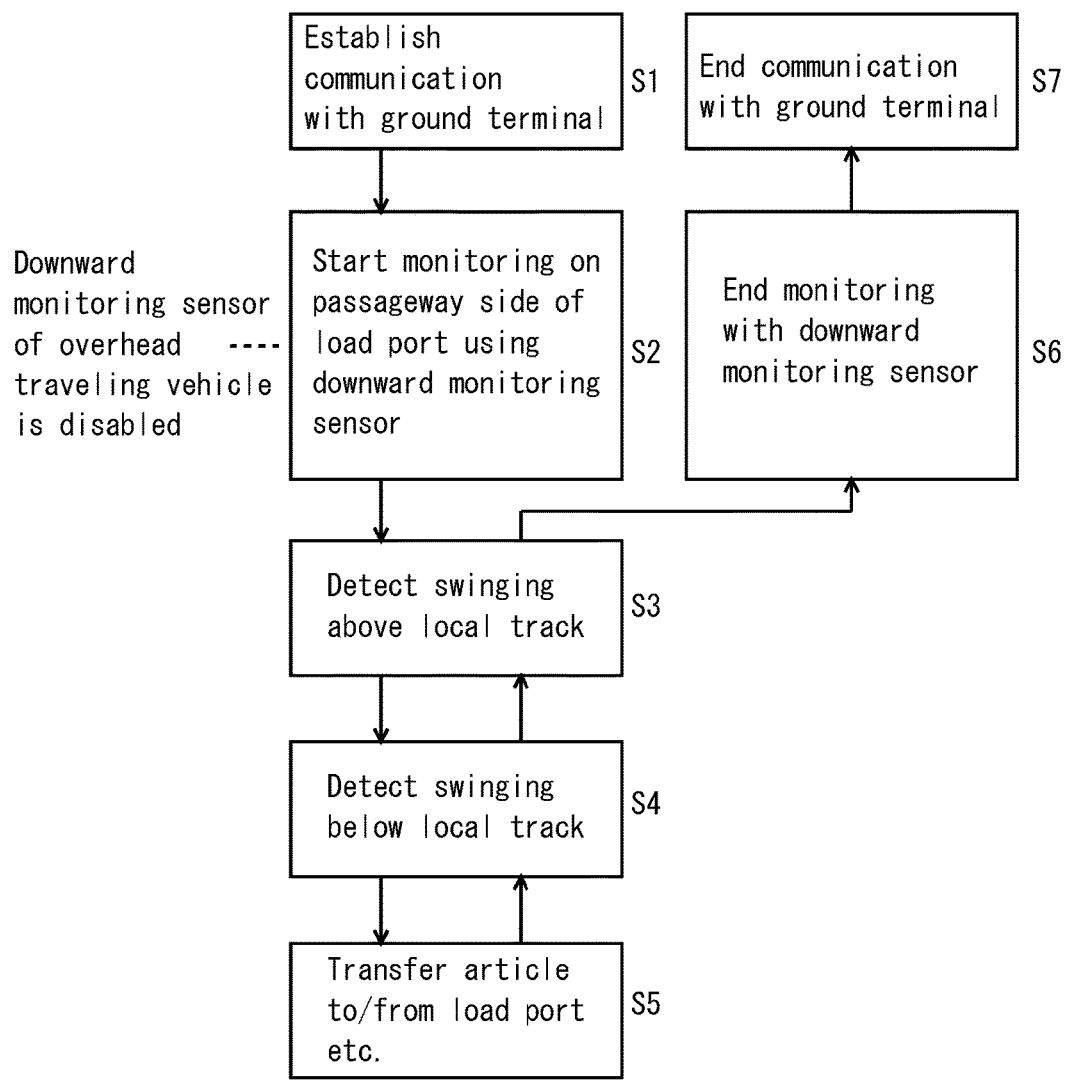

OVERHEAD TRAVELING VEHICLE SYSTEM AND TRANSFER CONTROL METHOD FOR OVERHEAD TRAVELING VEHICLE SYSTEM

BACKGROUND OF THE INVENTION

1. Field of the Invention

The present invention relates to an overhead traveling vehicle system, and in particular relates to a system in which an overhead traveling vehicle track and a local carriage track are arranged in a vertically overlapping manner over a load port.

2. Description of the Related Art

The inventor of the present invention has proposed arranging an overhead traveling vehicle track, a local carriage track, and buffers in a vertically overlapping manner over a load port (see, for example, JP 2012-111635A). This makes it possible to stock buffers with articles that are to be carried to and from the load port. In JP 2012-111635A, the buffers are arranged directly under the local carriage track, on both the upstream side and the downstream side of the load port, and the buffers are connected by a frame that is parallel to the track. This frame is provided with an obstacle sensor that monitors the area on the passageway side of the load port so as to prevent hoists or the like from coming into contact with an operator attempting to access the load port, for example.

However, with this arrangement, if a hoist or an article horizontally swings, there is the possibility of coming into contact with the frame over the load port. Also, although overhead traveling vehicles are generally provided with a sensor that detects an obstacle in the vicinity of the load port, there is the possibility of the local carriage track or the buffer frame being mistakenly detected as an obstacle by the sensor.

SUMMARY OF THE INVENTION

Preferred embodiments of the present invention easily carry articles to and from load ports while reliably detecting obstacles in the vicinity of the load ports and preventing overhead traveling vehicles from mistakenly detecting a local carriage track or the like as an obstacle.

An overhead traveling vehicle system according to a preferred embodiment of the present invention includes overhead traveling vehicles including a hoist configured to raise and lower an article and a first sensor configured to monitor an obstacle below; an overhead traveling vehicle track; a load port provided at a front surface of a processing device; a local carriage track provided at a position over the load port and directly under the overhead traveling vehicle track; a local carriage including a hoist configured to raise and lower an article and to travel along the local carriage track; a buffer to and from which both the overhead traveling vehicles and the local carriage carry an article by using the hoists; a second sensor attached to the local carriage track and configured to monitor an obstacle in a vicinity of the load port and in a passageway-side area on a side opposite to the processing device; and a communication terminal configured to transmit an obstacle detection signal from the second sensor to the overhead traveling vehicles and the local carriage; wherein both the overhead traveling vehicles and the local carriage are configured to carry articles to and from the load port by using the hoists; the buffer is suspended from the local carriage track by vertical supports that extend vertically downward, and no part of the buffer exists directly over the load port; the overhead traveling vehicles and the local carriage are configured or programmed to stop the hoists when the obstacle detection signal from the second sensor is received via the communication terminal; and the overhead traveling vehicles are configured or programmed such that obstacles in the passageway-side area are not monitored by the first sensor.

In a preferred embodiment of the present invention, transfer is controlled for an overhead traveling vehicle system including overhead traveling vehicles including a hoist configured to raise and lower an article and a first sensor configured to monitor an obstacle below; an overhead traveling vehicle track; a load port provided at a front surface of a processing device; a local carriage track provided at a position over the load port and directly under the overhead traveling vehicle track; a local carriage that includes a hoist configured to raise and lower an article, and to travel along the local carriage track; and a buffer to and from which the overhead traveling vehicles and the local carriage both carry an article using the hoist, both the overhead traveling vehicles and the local carriage being configured to carry articles to and from the load port by using the hoists, and the buffer being suspended from the local carriage track by vertical supports that extend vertically downward, and no part of buffer existing directly over the load port.

A transfer control method for the overhead traveling vehicle system according to a preferred embodiment of the present invention including attaching a second sensor to the local carriage track, the second sensor being configured to monitor an obstacle that is in a vicinity of the load port and in a passageway-side area on a side opposite to the processing device; providing a communication terminal configured to transmit an obstacle detection signal from the second sensor to the overhead traveling vehicles and the local carriage; causing the overhead traveling vehicles and the local carriage to stop the hoists when the obstacle detection signal from the second sensor is received via the communication terminal; and causing the overhead traveling vehicles not to monitor obstacles in the passageway-side area using the first sensor.

According to a preferred embodiment of the present invention, the buffer is suspended from the local carriage track by the vertical supports that extend vertically downward, and no part of the buffer is provided directly over the load port, thus making it possible for articles supported by the hoists to be carried to and from the load port without the hoists or the articles being hindered by a buffer frame or the like. Since no frame or the like exists directly over the load port, the second sensor is provided on the local carriage track and monitors obstacles vertically under on the passageway side of the load port. This makes it possible to reliably detect obstacles on the load port side. Also, the overhead traveling vehicles and the local carriage are configured or programmed to stop the hoists upon receiving the obstacle detection signal from the second sensor, thus achieving safety. Note that the obstacle is mainly the arm, helmet, or the like of an operator who is attempting to access the load ports, and articles over the load ports are able to be easily detected with separate sensors. The overhead traveling vehicles are configured or programmed such that obstacles in the passageway-side area are not monitored by the first sensor, and therefore transfer is not stopped due to mistakenly detecting the local carriage track or the like.

It is preferable that the local carriage track includes a pair of rails respectively on the processing device side and the passageway side, and a gap through which the article passes in a vertical direction is provided between the pair of rails, and the second sensor is provided on the rail on the passageway side. Since the second sensor is provided on the rail on the passageway side, the hoists and articles supported by the hoists are not mistakenly detected. This makes it possible to reliably detect obstacles in the passageway-side area.

It is particularly preferable that a switch is further provided that is connected to the second sensor and configured to establish communication between the overhead traveling vehicles or the local carriage and the communication terminal based on a condition that the second sensor has detected no obstacles, a plurality of the communication terminals are provided separately for each of the overhead traveling vehicle track and the local carriage track, and the communication terminals are connected to a processing device-side controller that manages carriage of articles to and from the load port, the overhead traveling vehicles and the local carriage carry articles to and from the load port while communicating with the communication terminals, and blockage of communication with the communication terminal acts as the obstacle detection signal for the overhead traveling vehicles and the local carriage.

With this configuration, due to the second sensor detecting an obstacle, communication that the communication terminals are performing with the overhead traveling vehicles and the local carriage ceases to be established, thus making it possible to cause the overhead traveling vehicles and the local carriage to automatically stop the hoists. Furthermore, compared to transmitting a transfer stop request signal or the like to the overhead traveling vehicles and the local carriage, transfer is more reliably stopped by performing transfer on the condition of established communication, and cutting off communication when an abnormality occurs. Furthermore, transfer is reliably stopped without involving a controller.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a diagram showing the transfer protocol for a load port and a buffer.

DETAILED DESCRIPTION OF THE PREFERRED EMBODIMENTS

The following describes preferred embodiments of the present invention. The scope of the present invention is determined by the claims, and is intended to be determined in accordance with the understanding of a person skilled in the art with reference to the description of the present invention and well-known techniques in the field of the present invention.

Figure 1:
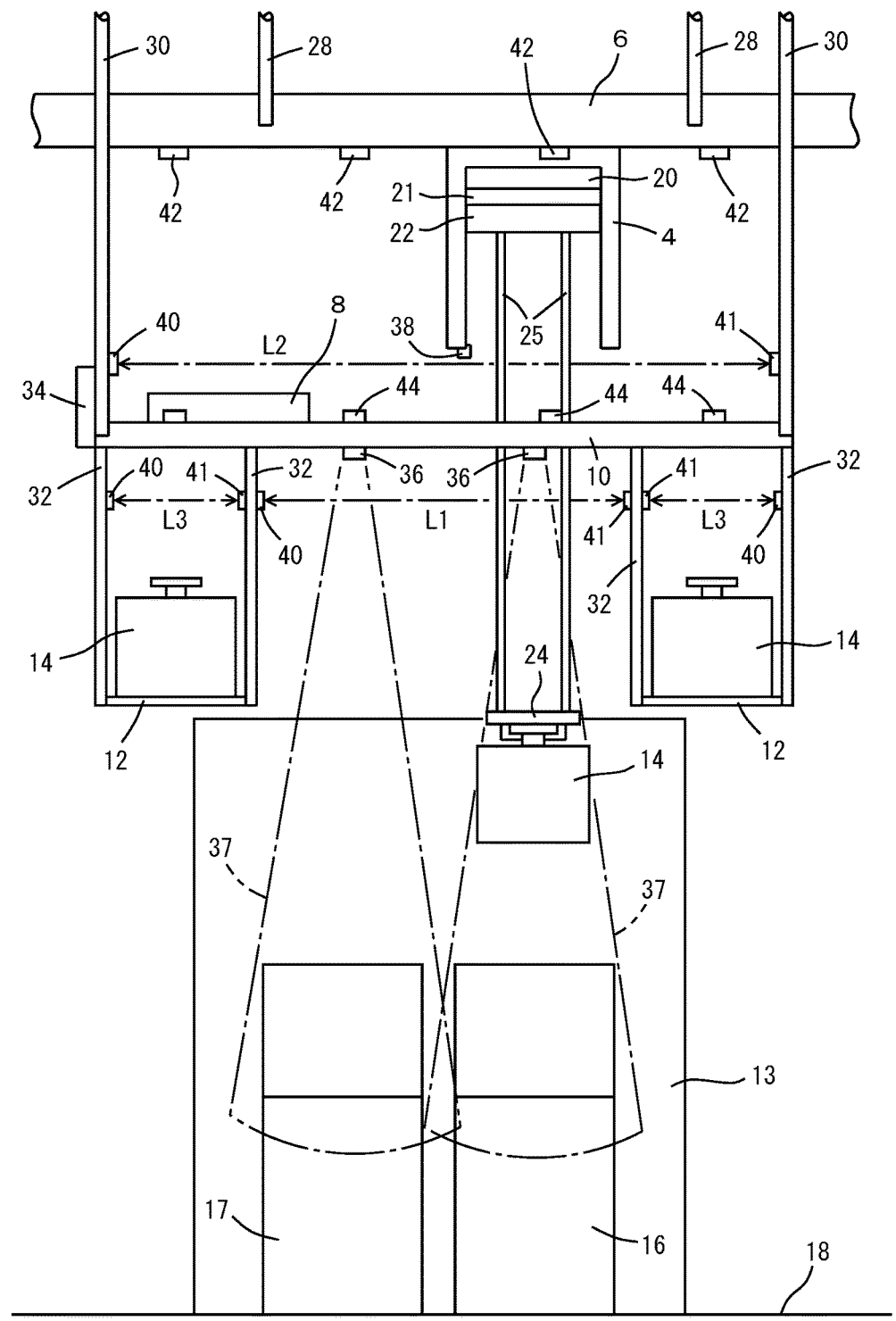
FIG. 1 is a side view of relevant portions of the overhead traveling vehicle system according to a preferred embodiment of the present invention.
Figure 2:
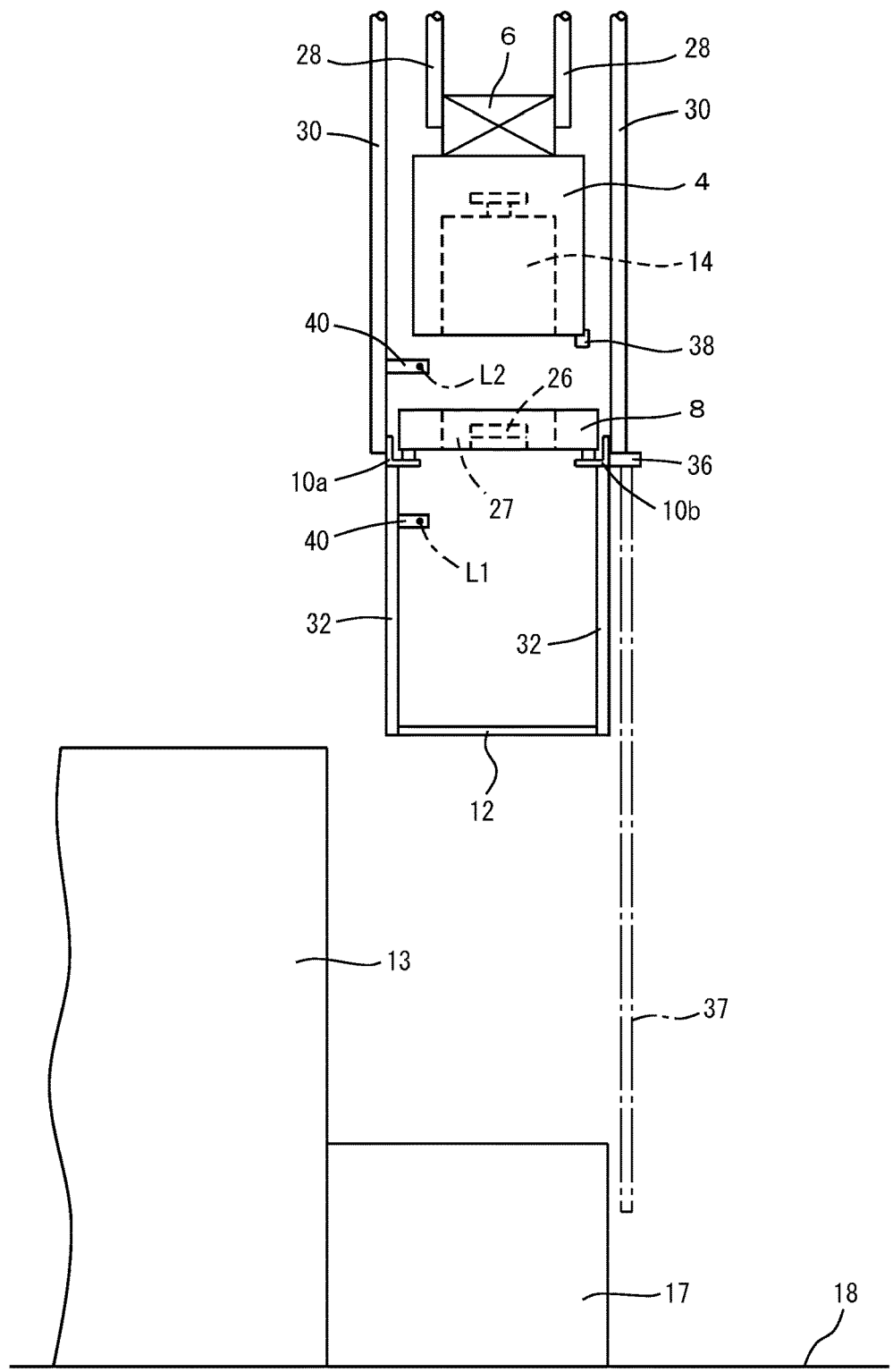
FIG. 2 is a front view of relevant portions of the overhead traveling vehicle system according to a preferred embodiment of the present invention.
Figure 3:
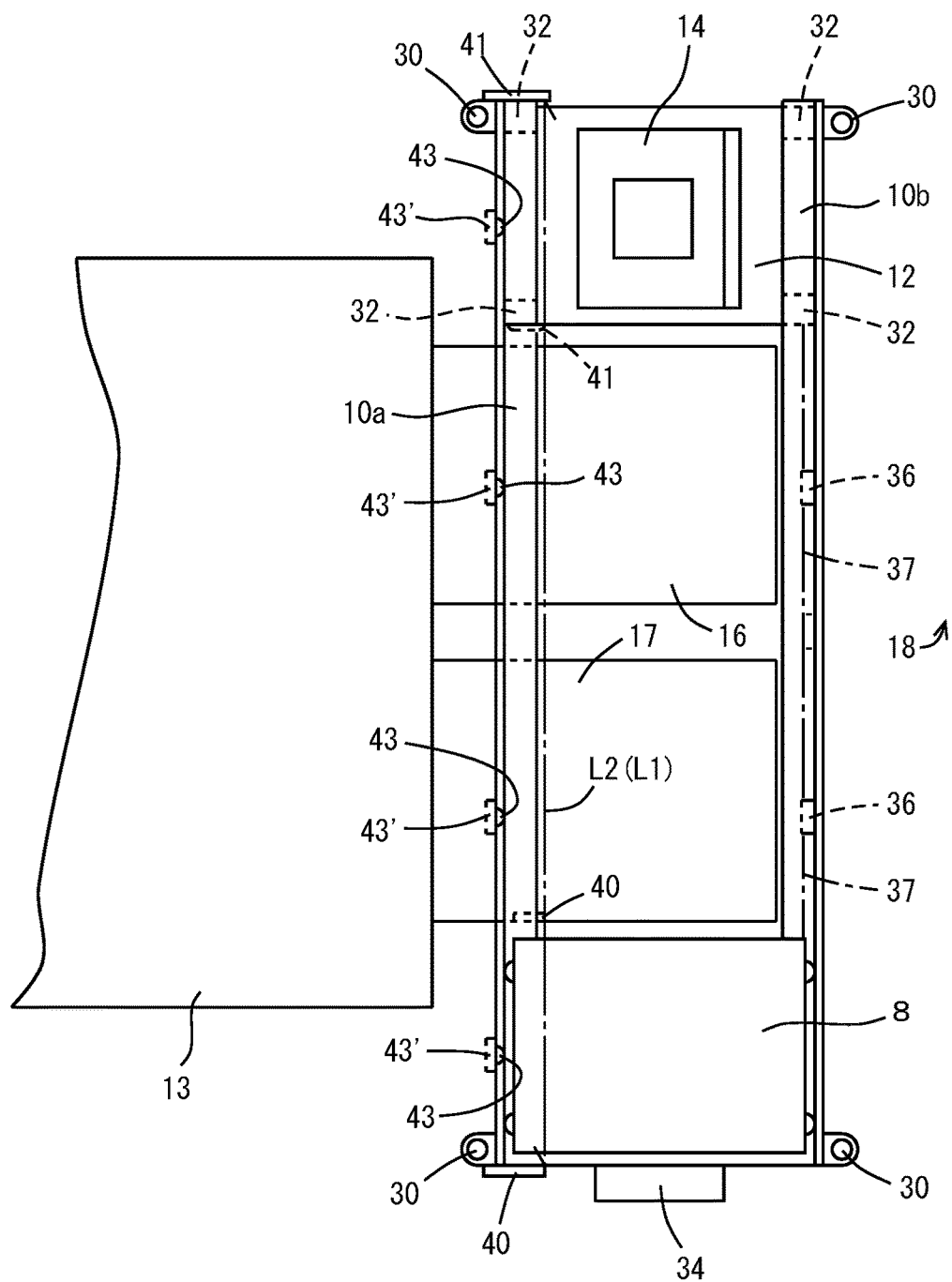
FIG. 3 is an enlarged plan view of relevant portions of the overhead traveling vehicle system according to a preferred embodiment of the present invention, in which an overhead traveling vehicle track are not shown.

An overhead traveling vehicle system 2 according to a preferred embodiment of the present invention is shown in FIGS. 1 to 7. An overhead traveling vehicle 4 is configured to travel along an overhead traveling vehicle track 6, and a local carriage 8 is configured to travel along a local carriage track 10. The local carriage track 10 is provided only in the neighborhood of load ports 16 and 17, and the overhead traveling vehicle track 6, the local carriage track 10, and the load ports 16 and 17 are arranged so as to vertically overlap each other in the stated order. Also, as shown in FIGS. 2 and 3, the local carriage track 10 includes a pair of left and right rails, namely a rail 10b on a passageway 18 side and a rail 10a on a processing device 13 side. The gap between the rails 10a and 10b is wider than the left-right width of an article 14 in FIG. 2, thus making it possible for the article 14 and later-described elevation platforms 24 and 26 to vertically pass through the gap between the rails 10a and 10b. Note that the processing device 13 may be provided with one load port, or three or more of them.

Buffers 12 are provided at positions that are directly under the local carriage track 10 while being outside the region directly over the load ports 16 and 17, and the buffers 12 are used for the placement of the articles 14, such as FOUPs. Buffers may be provided at other positions, but the buffers other than the buffers 12 directly under the track 10 are not directly related to the present preferred embodiment. Also, 18 indicates a passageway for operators and the like, and based on the load ports 16 and 17, one side in the horizontal plane is the processing device 13 side, and the other side is the passageway 18 side. Further, the passageway side of the load ports 16 and 17 is a monitoring area of downward monitoring sensors 36.

The overhead traveling vehicle 4 includes a lateral movement device 20, a rotation device 21, and a hoist 22, and the lateral movement device 20 laterally moves the rotation device 21 and the hoist 22 in a direction perpendicular or substantially perpendicular to the track 6 in the horizontal plane so as to be able to access buffers (not shown) provided to the left and right of the track 6. The rotation device 21 rotates the hoist 22 so as to change the orientation of the articles 14. The hoist 22 is configured to raise and lower an elevation platform 24 so as to move an article 14 between the load port 16 or 17 and a buffer 12, for example. Note that a configuration is possible in which the lateral movement device and the rotation device 21 are not provided. Belts 25 are configured to support the elevation platform 24, and preferably include four belts 25 of front, back, left, and right, for example, but other suspending members such as wires or ropes may be used in place of the belts 25.

The local carriage 8 includes wheels, a running motor, and the like configured to travel on the rails 10a and 10b, raise and lower the elevation platform 26 by using a hoist 27, and move articles 14 between the buffers 12 and the load ports 16 and 17. In the overhead traveling vehicle system 2, the overhead traveling vehicle 4 and the local carriage 8 are both configured to move articles 14 between the buffers 12 and the load ports 16 and 17. However, the overhead traveling vehicle system 2 may be operated such that the overhead traveling vehicle 4 carries articles to the buffers 12 and carries articles 14 from the load ports 16 and 17, and the local carriage 8 carries articles from the buffers 12 to the load ports 16 and 17, for example.

The tracks 6 and 10 preferably are suspended from the ceiling side by vertical supports 28 and 30, for example, and the buffers 12 preferably are suspended from the track 10 by vertical supports 32 that extend vertically downward. Also, the buffers 12 are provided along the lengthwise direction of the tracks 6 and 10 (the traveling direction of the overhead traveling vehicle 4 and the local carriage 8) on both the upstream side and the downstream side of the load ports 16 and 17, for example, but they may be provided on only either the upstream side or the downstream side. Further, members making up the buffers 12, such as horizontal frames thereof, are not provided directly over the load ports 16 and 17, so as to not hinder the buffers 12 from carrying articles 14 to and from the load ports.

A downward monitoring sensor 36 is provided directly over each of the load ports 16 and 17, and the downward monitoring sensors 36 monitor obstacles on the passageway side of the load ports 16 and 17. One example of an obstacle is an operator whose arm, helmet, or the like has come close to the load ports 16 and 17, and the downward monitoring sensors 36 are laser beam sensors that emit a beam 37 in a fan shape, for example, and detect reflected light from an obstacle. FIGS. 1 to 3 show the shape of the beam 37, and the area on the passageway 18 side relative to the load ports 16 and 17 is monitored, excluding the load ports 16 and 17 and the path along which the articles 14 are raised from and lowered to the load ports 16 and 17. The overhead traveling vehicle 4 includes a similar downward monitoring sensor 38 in order to detect obstacles blocking the load ports 16 and 17, but there is a high possibility of mistakenly detecting the track 10 for the local carriage 8. In view of this, with respect to the load ports 16 and 17, the signal from the downward monitoring sensor 38 of the overhead traveling vehicle 4 is invalidated. Note that although a downward monitoring sensor 36 preferably is provided for each of the load ports 16 and 17 in this preferred embodiment, the adjacent load ports 16 and 17 may be monitored by one downward monitoring sensor.

Besides monitoring obstacles on the passageway 18 side from the load ports 16 and 17, horizontal swinging of articles 14 supported on the elevation platforms 24 or 26 is detected. Specifically, since articles 14 pass through the gap between the rails 10a and 10b, there is the possibility of contact with the rails 10a or 10b if the articles 14 horizontally swing in a direction perpendicular or substantially perpendicular to the lengthwise direction of the local carriage track 10 in the horizontal plane. In particular, when an article 14 is raised, if the winding of the four belts 25 is not in synchronization, the possibility of horizontal swing starting is high. Also, there is a high possibility of horizontal swinging when articles 14 are raised from the load ports 16 and 17, whereas there is a low possibility of horizontal swinging when articles 14 are raised from the buffers 12. In view of this, horizontal swinging is detected based on whether or not an article 14 comes into contact with a monitoring line at the same position as or slightly inward from the inward end of the rail 10a in a plan view over and under the track 10, for example. In order to perform detection, a light projecting and receiving sensor 40, which includes a light emitting element and a light receiving element, and a mirror 41 are arranged at respective ends of the monitoring line. A monitoring line L1 is provided at least at a position that is over the load ports 16 and 17 and under the local carriage track 10, and it is preferable that a monitoring line L2 is provided over the local carriage track 10 as well. In addition to this, a monitoring line L3 may be added at a position that is over the buffers 12 and under the local carriage track 10.

FIG. 3 shows the arrangement of the sensors 36 and 40, and the downward monitoring sensor 36 on the rail 10b side uses a beam 37 to monitor an area on the passageway side of the load ports 16 and 17. Also, the inward end of the rail 10a and the monitoring line L2 at the same position or slightly inward (toward the rail 10b) in a plan view are monitored by a light projecting and receiving sensor 40 and a mirror 41. Further, the monitoring line L1 is vertically overlapped with the monitoring line L2, and is monitored by a light projecting and receiving sensor 40 and a mirror 41 attached to vertical supports 32 or the like. Note that a combination of a light emitting element and a light receiving element may be used in place of the light projecting and receiving sensor 40 and the mirror 41. Further, a light projecting and receiving sensor 40 and a mirror 41 may be provided on the rail 10b side as well. Also, a proximity sensor 43 that monitors the electrostatic capacitance with the ground and detects the approach of an article 14 based on a change in the electrostatic capacitance, for example, may be used in place of the light projecting and receiving sensor 40 and the mirror 41. For example, a pole 43' extending in the up-down direction may be attached to the rail 10a, and the proximity sensor 43 may be attached to the pole 43'.

Figure 4:
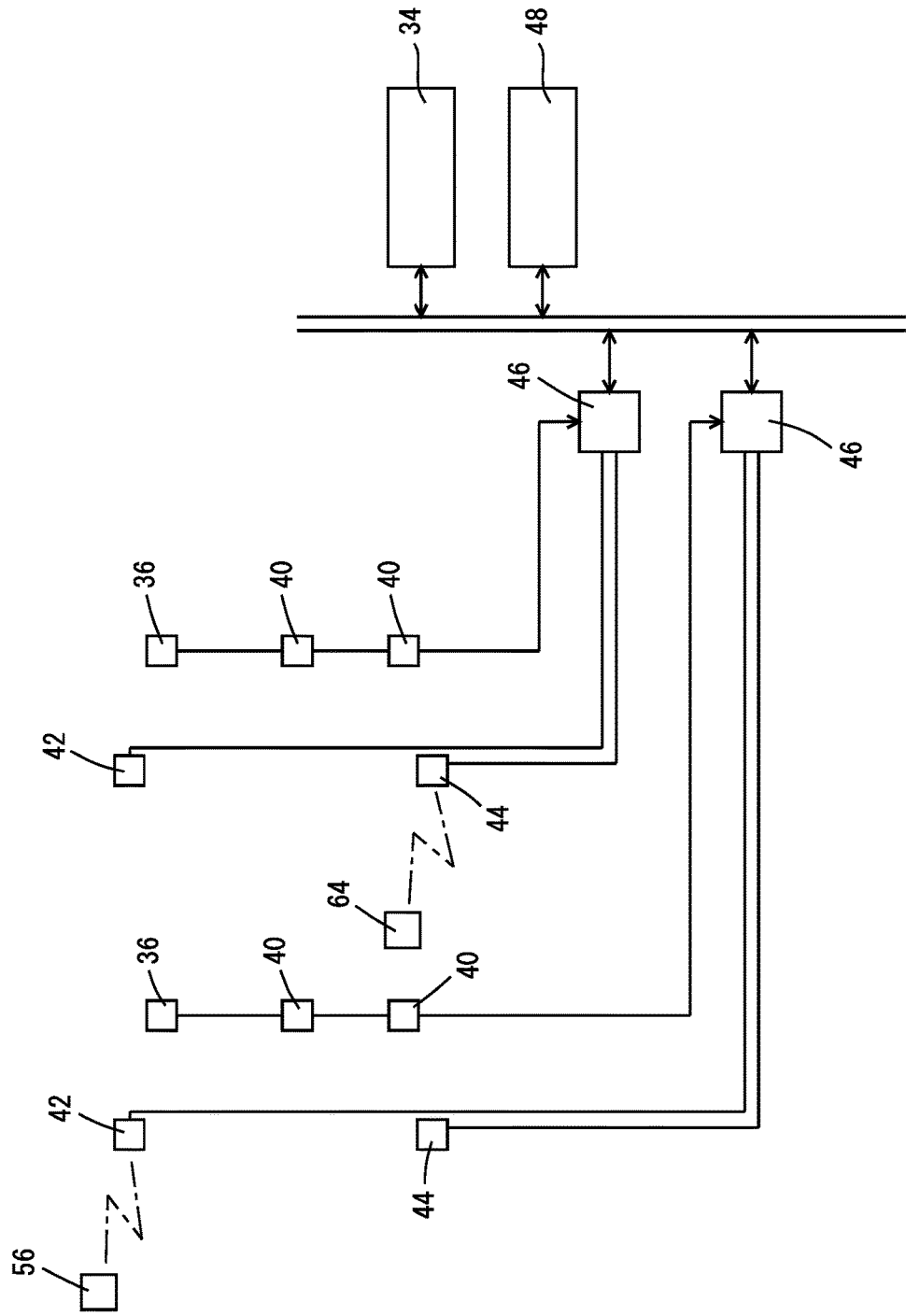
FIG. 4 is a block diagram from a ground terminal to a ground controller according to a preferred embodiment of the present invention.

As shown in FIG. 1, a ground terminal 42 that communicates with a communication terminal of the overhead traveling vehicle 4 is provided at each transfer position along the track 6, and a ground terminal 44 that communicates with a communication terminal of the local carriage 8 is provided at each transfer position along the track 10. Note that the terminals 42 and 44 are not shown in FIGS. 2 and 3. FIG. 4 illustrates communication and monitoring when transfer is performed. The overhead traveling vehicle 4 includes a communication terminal 56, and the local carriage 8 includes a communication terminal 64. A local carriage controller 34 is configured or programmed to manage the local carriage and the carrying of articles to and from the buffers, and a controller 48 on the processing device side is configured or programmed to manage the carrying of articles to and from the load ports. A switch 46 is provided for each pair of a buffer and a load port, and these switches 46 connect the controllers 34 and 48 to the communication terminals 42 and 44 and enable communication between one of the communication terminals 42 and 44 and the overhead traveling vehicle 4 or the local carriage 8. Also, signals from the downward monitoring sensor 36 and the upper and lower light projecting and receiving sensors 40 are input to the switches 46, and when any of the sensors detects an obstacle, the switches 46 prohibit the communication that the communication terminals 42 and 44 perform with the overhead traveling vehicle 4 and local carriage 8.

The overhead traveling vehicle 4 and the local carriage 8 are configured to transmit a transfer request signal to the terminals 42 and 44 when transferring an article to or from a buffer or a load port. Transfer preferably is started upon receiving a transfer confirmation signal (a signal indicating that transfer is permitted) in response. Also, communication is maintained until transfer is complete, and if communication is interrupted during this time, the raising and lowering of the elevation platform is stopped, and the resumption of communication is waited for. The overhead traveling vehicle 4 and the local carriage 8 exchange signals with the terminals 42 and 44 until the transfer ends. Note that in place of blocking communication, obstacle detection signals may be transmitted to the overhead traveling vehicle 4 or the local carriage 8 using signals from the downward monitoring sensors 36 and the upper and lower light projecting and receiving sensors 40, but control becomes complicated since the number of types of signals increases.

Figure 5:
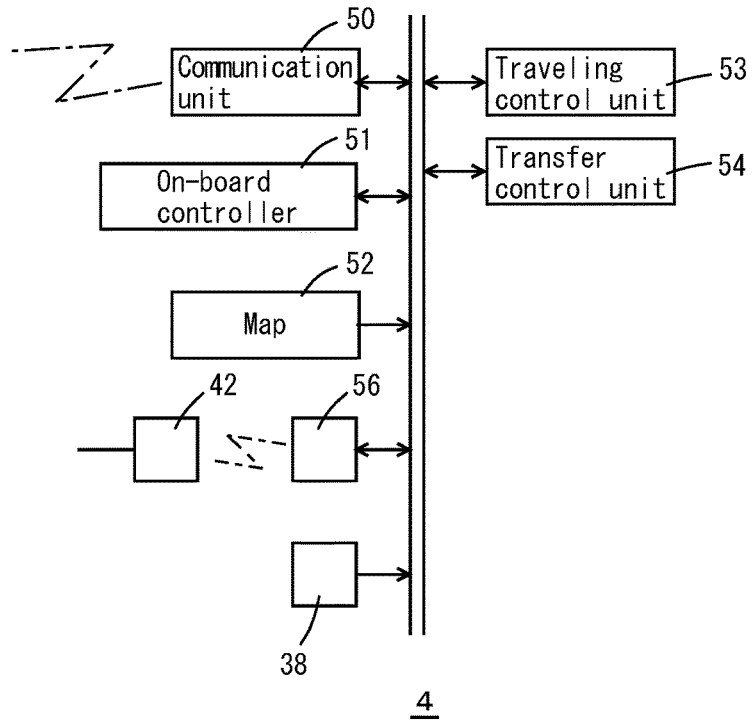
FIG. 5 is a block diagram of the overhead traveling vehicle system according to a preferred embodiment of the present invention.

FIG. 5 shows the control system of the overhead traveling vehicle 4. A communication device 50 is configured to communicate with an overhead traveling vehicle controller (not shown) and receive transport instructions, an on-board controller 51 is configured or programmed to perform overall control of the overhead traveling vehicle 4, and a map storage 52 is configured to store arrangement data regarding the track 6. This data includes the transfer positions and whether or not monitoring by the downward monitoring sensor 38 is necessary during transfer, for example. According to the data in the map storage 52, downward monitoring is not necessary for the load ports 16 and 17 provided with the downward monitoring sensors 36, and the downward monitoring sensor 38 is switched off, or the signal therefrom is ignored. The communication terminal 56 is configured to communicate with the ground terminal 42, exchange signals in accordance with the transfer protocol, and maintain communication during transfer. The traveling controller 53 is configured or programmed to control the traveling of the overhead traveling vehicle 4, and the transfer controller 54 is configured or programmed to control the hoist 22 and the like.

Figure 6:
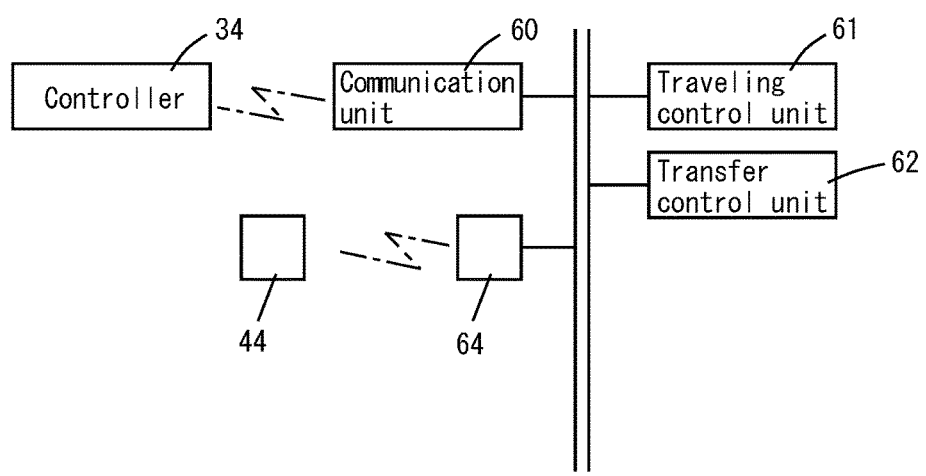
FIG. 6 is a block diagram of the local carriage according to a preferred embodiment of the present invention.

FIG. 6 shows the control system of the local carriage 8. A communication device 60 is configured to communicate with the local carriage controller 34 and receives instructions. The communication terminal 64 is configured to communicate with the ground terminal 44, exchange signals in accordance with the transfer protocol, and maintain communication during transfer. The traveling controller 61 is configured or programmed to control the traveling of the local carriage 8, and the transfer controller 62 is configured or programmed to control the hoist 27.

FIG. 7 illustrates the transfer protocol. Before transfer to and from the buffers 12 and the load ports 16 and 17, the overhead traveling vehicle 4 and the local carriage 8 establish communication with the ground terminals 42 and 44 (step 1). Hereinafter, the ground terminals 42 and 44 are assumed to be terminals corresponding to the same buffer 12 or the same load port 16 or 17. The switches 46 enable communication with only one of the ground terminals 42 and 44 at a time, and therefore it is not possible for the overhead traveling vehicle 4 and the local carriage 8 to start transfer to and from the same buffer 12 or the same load port 16 or 17 at the same time. Also, by default, the switches 46 are switched to a state in which the ground terminal 42 is capable of performing communication and the ground terminal 44 cannot perform communication. The local carriage controller 34 changes the states of switches 46 so as to allow the communications via the ground terminal 44 for the region where the local carriage 8 is going to run. The state for communication with the ground terminals 42, 44 cannot be changed from when communication starts until when transfer ends. According to this, the local carriage 8 cannot enter the region under the position where the overhead traveling vehicle 4 started communication. Also, the overhead traveling vehicle 4 cannot request communication in the region over the position where the local carriage 8 started communication.

The overhead traveling vehicle 4 and the local carriage 8 exchange transfer request signals and transfer confirmation signals with the ground terminals 42 and 44 before transfer starts, and then lower the elevation platforms and start transfer. For example, when transfer starts, the downward monitoring sensors 36 attached to the local carriage track 10 start performing monitoring (step 2), and when an obstacle such as a worker attempting to access the load port 16 or 17 is detected, the switches 46 prohibit communication with the ground terminals 42 and 44. When communication is cut off, the overhead traveling vehicle 4 and the local carriage 8 stop raising and lowering the elevation platforms, and wait until the downward monitoring sensors 36 no longer detect an obstacle. Also, in accordance with the data in the map, either the downward monitoring sensor 38 of the overhead traveling vehicle 4 may be switched off, or the signal from the downward monitoring sensor 38 of the overhead traveling vehicle 4 may be ignored.

When an article 14 passes through the region over the local carriage track 10 and passes through the region just under it, horizontal swinging of the article is monitored by the light projecting and receiving sensor 40 (steps 3 and 4), and if the light projecting and receiving sensor detects a horizontally swinging article, the hoist is stopped, and subsiding of the horizontal swinging is waited for. This monitoring is performed in order to prevent the article from interfering with the local carriage track 10, and the monitoring of the region under the track 10 may be omitted when the elevation platform is being lowered. Note that with respect to the buffers 12, the monitoring of the region under the track 10 may be omitted due to the fact that, for example, the track 10 is passed immediately after rising starts.

After an article is transferred to and from the load port 16 or 17 or the buffer 12 (step 5), the elevation platform is raised. Monitoring by the downward monitoring sensors 36 continues, and horizontal swinging of an article is monitored by the light projecting and receiving sensors 40 when the article passes through the region just under the local carriage track 10 and passes through the region over it (steps 3 and 4). Also, the monitoring of the region over the track 10 may be omitted when the elevation platform is being raised.

When the elevation platform has returned to the vehicles, monitoring by the downward monitoring sensors is ended (step 6), the overhead traveling vehicle 4 and the local carriage 8 exchange a signal indicating that transfer ended with the ground terminals 42 and 44, and communication is ended (step 7). Note that the monitoring by the downward monitoring sensors may be ended when, for example, the article has been raised to the vicinity of the track 10.

Advantages described below are obtained in this preferred embodiment.

The frame or the like of the buffers 12 are not provided directly over the load ports 16 and 17, thus facilitating the transfer of articles 14.

An obstacle directly under is detected by the downward monitoring sensors 36 attached to the rail 10b, thus making it possible to reliably detect obstacles on the passageway side of the load ports 16 and 17.

The downward monitoring sensor 38 of the overhead traveling vehicle 4 is not used, thus preventing the local carriage track 10 or the like from being mistakenly detected as an obstacle.

Horizontal swinging of an article 14 is detected by the light projecting and receiving sensors 40 before the article 14 passes through the local carriage track 10, thus making it possible to prevent the article 14 from coming into contact with the local carriage track 10.

The downward monitoring sensors 36 and the light projecting and receiving sensors 40 preferably are for both the overhead traveling vehicle 4 and the local carriage 8.

Both when a downward monitoring sensor 36 detects an obstacle, and when alight projecting and receiving sensor 40 detects horizontal swinging, the raising and lowering the elevation platforms preferably are stopped by prohibiting communication with the ground terminals 42 and 44.

Communication is prohibited by the switches 46 based on signals from the downward monitoring sensors 36 or the light projecting and receiving sensors 40, without involving the controllers 34 and 48, thus making it possible to more reliably stop the transfer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An overhead traveling vehicle system for carrying articles to and from a load port provided at a front surface of a processing device, the overhead traveling vehicle system comprising:
   overhead traveling vehicles each including a hoist configured to raise and lower an article and a first sensor configured to monitor an obstacle below;
   an overhead traveling vehicle track;
   a local carriage track provided at a position over the load port and directly under the overhead traveling vehicle track;
   a local carriage including a hoist configured to raise and lower an article and to travel along the local carriage track;
   a buffer to and from which both the overhead traveling vehicles and the local carriage carry an article by using the hoists;
   a second sensor configured to monitor an obstacle in a vicinity of the load port and in a passageway-side area on a side opposite to the processing device;
   a communication terminal configured to transmit an obstacle detection signal from the second sensor to the overhead traveling vehicles and the local carriage; and
   a map storage configured to determine whether or not the first sensor is to monitor an obstacle in the vicinity of the load port based on a predetermined condition; wherein
   both the overhead traveling vehicles and the local carriage are configured to carry articles to and from the load port by using the hoists;
   the buffer is suspended from the local carriage track by vertical supports that extend vertically downward, and no part of the buffer exists directly over the load port;
   the overhead traveling vehicles and the local carriage are configured or programmed to stop the hoists when the obstacle detection signal from the second sensor is received via the communication terminal;
   the overhead traveling vehicles are configured or programmed such that obstacles in the passageway-side area are not monitored by the first sensor;
   the first sensor monitors an obstacle in the vicinity of the load port when the map storage determines that the predetermined condition is not met, and does not monitor an obstacle in the vicinity of the load port when the map storage determines that the predetermined condition is met;
   a switch is connected to the second sensor and configured to establish communication between the overhead traveling vehicles or the local carriage and the communication terminal based on a condition that the second sensor has detected no obstacles;
   a plurality of the communication terminals are provided separately for the overhead traveling vehicle track and the local carriage track;
   the communication terminals are connected to a processing device-side controller configured or programmed to manage carriage of articles to and from the load port;
   the overhead traveling vehicles and the local carriage are configured to carry articles to and from the load port while communicating with the communication terminals; and
   the overhead traveling vehicles and the local carriage are configured or programmed such that blockage of communication with the communication terminal acts as the obstacle detection signal.

2. The overhead traveling vehicle system according to claim 1, wherein
   the local carriage track includes a pair of rails respectively on the processing device side and the passageway side;
   a gap through which the article passes in a vertical direction is provided between the pair of rails; and
   the second sensor is provided on the rail on the passageway side.

3. A transfer control method for an overhead traveling vehicle system for carrying articles to and from a load port provided at a front surface of a processing device, the overhead traveling vehicle system including overhead traveling vehicles each including a hoist configured to raise and lower an article and a first sensor configured to monitor an obstacle below, an overhead traveling vehicle track, a local carriage track provided at a position over the load port and directly under the overhead traveling vehicle track, a local carriage that includes a hoist configured to raise and lower an article and travels along the local carriage track, and a buffer to and from which both the overhead traveling vehicles and the local carriage carry an article by using the hoists, both the overhead traveling vehicles and the local carriage being configured to carry articles to and from the load port by using the hoists, and the buffer being suspended from the local carriage track by vertical supports that extend vertically downward, and no part of the buffer existing directly over the load port, the transfer control method comprising:
   attaching a second sensor that monitors an obstacle in a vicinity of the load port and in a passageway-side area, which is on a side opposite to the processing device, to the overhead traveling vehicle system;
   providing a communication terminal that transmits an obstacle detection signal from the second sensor to the overhead traveling vehicles and the local carriage;
   providing a map storage that determines whether or not the first sensor is to monitor an obstacle in the vicinity of the load port based on a predetermined condition;
   causing the overhead traveling vehicles and the local carriage to stop the hoists when the obstacle detection signal from the second sensor is received via the communication terminal;
   causing the overhead traveling vehicles not to monitor obstacles in the passageway-side area with the first sensor; and
   causing the first sensor to monitor an obstacle in the vicinity of the load port when the map storage determines that the predetermined condition is not met, and causing the first sensor not to monitor an obstacle in the vicinity of the load port when the map storage determines that the predetermined condition is met; wherein
   a switch is connected to the second sensor to establish communication between the overhead traveling vehicles or the local carriage and the communication terminal based on a condition that the second sensor has detected no obstacles;

a plurality of the communication terminals are provided separately for the overhead traveling vehicle track and the local carriage track;

the communication terminals are connected to a processing device-side controller to manage carriage of articles to and from the load port;

the overhead traveling vehicles and the local carriage carry articles to and from the load port while communicating with the communication terminals; and blockage of communication between the overhead traveling vehicles or the local carriage with the communication terminal acts as the obstacle detection signal.

* * * * *